(12) United States Patent
Jiang et al.

(10) Patent No.: US 8,834,655 B2
(45) Date of Patent: Sep. 16, 2014

(54) METHOD FOR ISOLATING FLEXIBLE SUBSTRATE FROM SUPPORT SUBSTRATE

(75) Inventors: Liang-You Jiang, Taipei County (TW); Janglin Chen, Kaohsiung County (TW); Yu-Yang Chang, Hsinchu County (TW); Dong-Sen Chen, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 809 days.

(21) Appl. No.: 12/571,833

(22) Filed: Oct. 1, 2009

(65) Prior Publication Data
US 2010/0264112 A1    Oct. 21, 2010

(30) Foreign Application Priority Data
Apr. 17, 2009 (TW) ................ 98112767 A

(51) Int. Cl.
 *B32B 37/00* (2006.01)
 *H01L 21/683* (2006.01)
 *G02F 1/1333* (2006.01)

(52) U.S. Cl.
CPC ........ *B32B 37/0076* (2013.01); *H01L 21/6835* (2013.01); *B32B 2457/20* (2013.01); *H01L 2221/68345* (2013.01); *G02F 2001/133302* (2013.01)
USPC ........................................... 156/60; 156/250

(58) Field of Classification Search
CPC ............ H01L 27/1266; H01L 21/6835; H01L 2221/68368; H01L 2221/68359; G02F 1/133305; B32B 2457/20; B32B 37/025; B32B 37/0076; B32B 2405/00; B32B 2457/206; B32B 2255/26; B32B 2255/28
USPC ............ 156/168, 230, 235, 247, 249; 257/66; 427/158, 256, 352 M, 558; 428/172, 428/195.1, 209, 216, 32.8, 343, 344, 352, 428/36.7, 41.5, 412, 423.1, 90; 430/325, 430/501; 438/110, 149, 166, 197, 30, 455, 438/458, 472, 584
See application file for complete search history.

(56) References Cited

U.S. PATENT DOCUMENTS

| 6,572,780 B2 * | 6/2003 | McCormack et al. .......... 216/13 |
| 7,279,401 B2 | 10/2007 | Wong et al. |
| 2002/0044177 A1 * | 4/2002 | Taneya et al. ................... 347/65 |
| 2002/0117256 A1 * | 8/2002 | McCormack et al. ........ 156/289 |
| 2004/0026363 A1 * | 2/2004 | Akamatsu et al. .............. 216/13 |
| 2007/0116948 A1 * | 5/2007 | Kim et al. ..................... 428/343 |

FOREIGN PATENT DOCUMENTS

| JP | 2004-250487 A | 9/2004 |
| KR | 10-0810708 B1 | 3/2008 |

(Continued)

OTHER PUBLICATIONS

Notice of Preliminary Rejection dated Jul. 26, 2011; "Method for Isolating Flexible Film From Support Substrate"; pp. 1-5.

*Primary Examiner* — Duy Deo
*Assistant Examiner* — Erin Bergner
(74) *Attorney, Agent, or Firm* — Birch, Stewart, Kolasch & Birch, LLP

(57) ABSTRACT

A method for isolating a flexible substrate from a support substrate and method for fabricating a flexible electronic device are provided. The method for isolating a flexible substrate from a support substrate includes providing a flexible substrate with a bottom surface. A surface treatment is subjected to the bottom surface of the flexible substrate, forming a bottom surface with detachment characteristics. The flexible substrate is fixed on the support substrate by means of an adhesive layer, wherein the bottom surface with detachment characteristics faces the support substrate. The flexible substrate is cut and isolated from the support substrate.

21 Claims, 10 Drawing Sheets

(56) References Cited

FOREIGN PATENT DOCUMENTS

| KR | 10-2008-0057874 A | 6/2008 |
|---|---|---|
| KR | 10-0879207 B1 | 1/2009 |
| TW | I262036 B | 9/2006 |
| TW | 200712607 | 4/2007 |
| TW | I288493 | 10/2007 |
| TW | 200829982 A | 7/2008 |
| WO | WO 2007/078130 A1 | 7/2007 |

* cited by examiner

METHOD FOR ISOLATING FLEXIBLE SUBSTRATE FROM SUPPORT SUBSTRATE

CROSS REFERENCE TO RELATED APPLICATIONS

This application is based upon and claims the benefit of priority from the prior Taiwan Patent Application No. 098112767, filed on Apr. 17, 2009, the entire contents of which are incorporated herein by reference.

BACKGROUND OF THE INVENTION

1. Field of the Invention

The invention relates to a method for isolating a flexible substrate from a support substrate.

2. Description of the Related Art

Flat panel displays (FPDs) employing a plastic substrate are relatively lighter, thinner and more flexible than other types of FPDs and can be fabricated in large sizes. Thus, popular has grown.

To fabricate a pixel array substrate of a flexible FPD, a plastic substrate is affixed on a carrier substrate, and then pixel structures (such as thin film transistors) are formed on the plastic substrate. A sheet-to-sheet fabrication process is used.

Despite advantages of FPDs employing a plastic substrate, however, due to current processing techniques, it is difficult to further increase fabrication yields and decrease costs. Specifically, one area of technical difficulty in the fabrication process is to efficiently separate the plastic substrate from the glass substrate after the pixel structures are formed.

BRIEF SUMMARY OF THE INVENTION

An exemplary embodiment of a method for isolating a flexible substrate from a support substrate is provided and includes: providing a flexible substrate with a bottom surface; subjecting the bottom surface of the flexible substrate to a surface treatment, thereby forming a bottom surface with detachment characteristics; fixing the flexible substrate on a support substrate via an adhesive layer, wherein the bottom surface with detachment characteristics faces the support substrate; and isolating the flexible substrate from the support substrate.

Another exemplary embodiment of a method for fabricating a flexible electronic device includes: providing a flexible substrate with a top surface and a bottom surface; subjecting a part of the bottom surface of the flexible substrate to a surface treatment, thereby forming a mold release region, wherein an adhesive region is the part of the bottom surface beyond the mold release region; fixing the flexible substrate on a support substrate via an adhesive layer, wherein the adhesive layer covers the adhesive region and the mold release region; forming an electronic element on the top surface of the flexible substrate; and cutting the flexible substrate within the mold release region to isolate a flexible electronic device from the support substrate.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
FIGS. 1a-1d are cross sections of a method for isolating a flexible substrate from a support substrate according to an embodiment of the invention.

First, as shown in FIG. 1a, a flexible substrate 10 is provided, wherein the flexible substrate 10 has a bottom surface 11. The flexible substrate 10 can be a polymeric substrate or a metallic substrate. In this embodiment, the flexible substrate 10 is a polymeric substrate, such as polyimide (PI), polycarbonate (PC), polyethersulfone (PES), polynorbornene (PNB), polyetherimide (PEI), polyethylene naphthalate (PEN) or polyethylene terephthalate (PET).

Figure 1B:
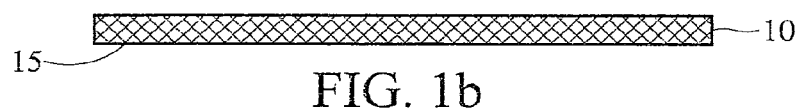
Figure 2:
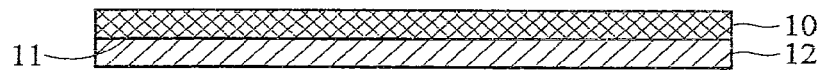
FIG. 2 shows a schematic diagram illustrating a flexible substrate subjected to a surface treatment employing a chemical agent.

Next, referring to FIG. 1b, the bottom surface 11 of the flexible substrate 10 is subjected to a surface treatment to form a bottom surface with detachment characteristics 15. Herein, the surface treatment can include the steps of providing a chemical agent 12 to react with the bottom surface 11 of the flexible substrate 10 (referring to FIG. 2), and obtaining the flexible substrate 10 having a bottom surface with detachment characteristics 15 (referring to FIG. 1b). Further, according to embodiments of the invention, the surface treatment can also be a plasma treatment, an ion beam bombardment, an etching treatment, a rubbing treatment, or combinations thereof. In another embodiment of the present invention, the surface treatment includes a plasma treatment. The bottom surface of the flexible substrate is subjected to a plasma treatment, wherein the carrier gas includes argon gas and the reaction gas includes $CF_2$, $CF_3$ or silicon-containing gas. The plasma is formed at atmospheric pressure and can consume or displace the hydroxyl group, forming a bottom surface with detachment characteristics.

It should be noted that, after subjecting the bottom surface 11 of the flexible substrate 10 to the surface treatment, functional groups of the bottom surface 11 of the flexible substrate 10, which are able to form bonds with the adhesive layer, are consumed, covered or displaced. Therefore, the adherence between the bottom surface with detachment characteristics 15 and a sequentially provided adhesive layer is greatly reduced. Herein, the functional groups which are able to be bonded with the adhesive layer can include hydroxyl group, carboxyl group, amino group, or ester group. Further, the bonds formed between the bottom surface of the flexible substrate and the adhesive layer can include ionic bond, covalent bond or hydrogen bond.

According to an embodiment of the invention, the chemical agent 12 can react with the functional groups of the bottom surface 11 of the flexible substrate 10 undergoing an addition, elimination, or displacement reaction. The chemical agent can have the structure represented by

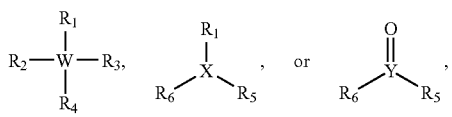

wherein W is C, Si, or Ge, X is S or Se, Y is C or S.

$R_1$, $R_2$, and $R_3$ are independent and include H, alkenyl group, alkyl group, or —OR, R is $C_{1-18}$ alkyl group.

$R_4$ is F, Cl, Br, I, carboxyl group, amino group, amine group, cyano group, amide group, alkyl halide group, or combinations thereof, and $R_5$ and $R_6$ are independent and include F, Cl, Br, I, alkyl group, alkenyl group, carboxyl group, amino group, amine group, cyano group, amide group, alkyl halide group, or combinations thereof.

For example, the chemical agent 12 can include dimethyl chlorosilane, trimethyl chlorosilane, tert-butyl chloride, chloromethyl trimethylsilane, 2-bromopropane, dimethyl dichlorosilan, trimethyl fluorosilane, trimethyl bromosilane, trimethyl iodosilane, trimethylsilyl cyanide, thionyl chloride, triethyl chlorosilane, or combinations thereof. The chemical agent is not limited and can be a liquid agent, a gaseous agent, and a solid agent, preferably a liquid agent. The chemical agent has a boiling point less than 200° C., preferably less than 100° C. Most preferably, the chemical agent is a liquid agent at room temperature.

Figure 1C:
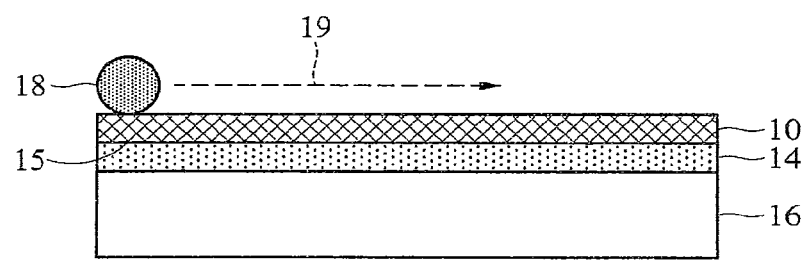

Next, as shown in FIG. 1c, the flexible substrate 10 is disposed and fixed on a support substrate 16 via an adhesive layer 14, wherein the bottom surface with detachment characteristics 15 faces the support substrate 16 and directly contacts to the adhesive layer 14. In this step, a roller 18 is provided to trundle toward a specific direction 19, facilitating the combination of the flexible substrate 10 and the adhesive layer 14.

The support substrate 16 exhibits sufficient rigidness, such as a metallic substrate, a plastic substrate, a ceramic substrate, a glass substrate, or a silicon wafer. Herein, the support substrate 16 can be a glass substrate.

Figure 1D:
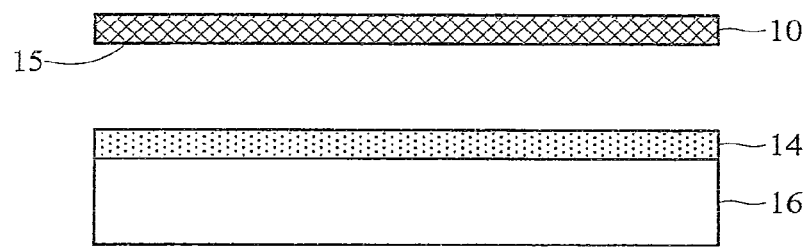

Herein, the functional groups which can form bonds with the adhesive layer, of the bottom surface with detachment characteristics 15 of the flexible substrate 10 are consumed, covered or displaced by the chemical agent. When compared to a surface without the surface treatment of the flexible substrate 10, the surface with the surface treatment of the flexible substrate 10 has lower adherence to the adhesive layer 14. Finally, as shown in FIG. 1d, the flexible substrate 10 is isolated from the support substrate 16.

Figure 3A:
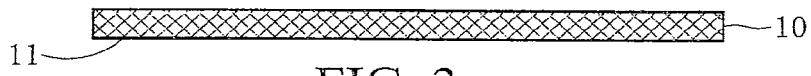
FIGS. 3a-3e are cross sections of a method for isolating a flexible substrate from a support substrate according to another embodiment of the invention.
Figure 3B:
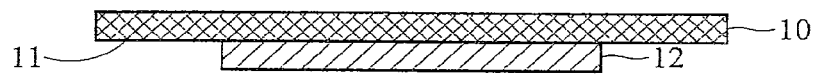
Figure 3C:
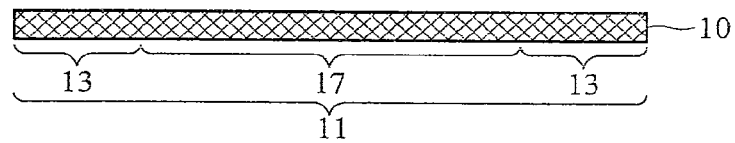
Figure 4:
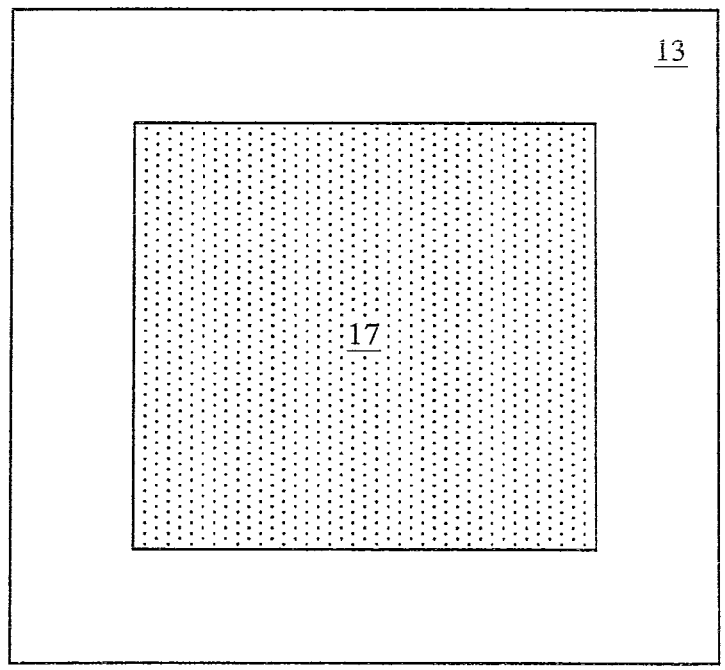
FIG. 4 is a bottom view of the structure shown in FIG. 3c.

Further, according to another embodiment of the invention, the method for isolating a flexible substrate from a support substrate includes the following steps. First, as shown in FIG. 3a, a flexible substrate 10 having a bottom surface 11 is provided. Next, as shown in FIGS. 3b and 3c, a part of the bottom surface 11 of the flexible substrate 10 is subjected to a surface treatment, thereby forming a mold release region 17, wherein an adhesive region 13 is the part of the bottom surface 11 beyond the mold release region 17. FIG. 4 is a bottom-view of the structure shown in FIG. 3c.

Figure 5:
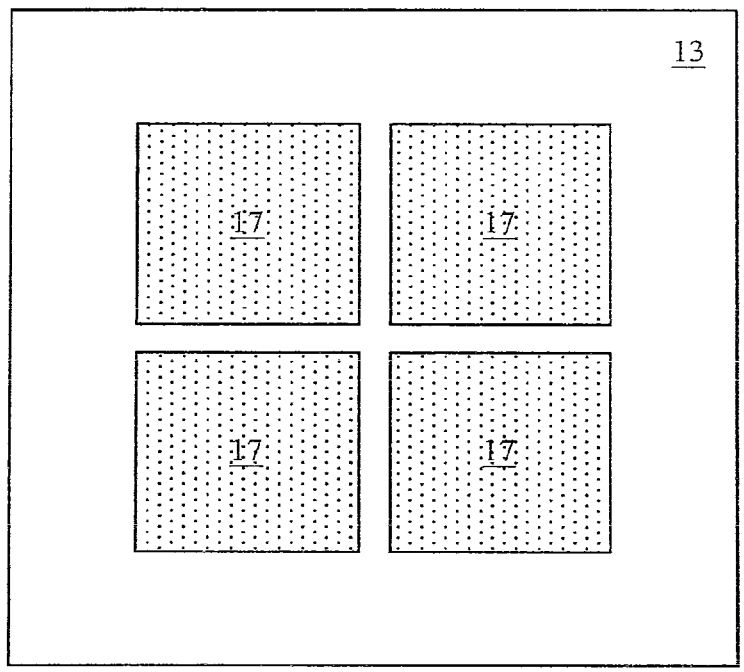
FIG. 5 shows a schematic diagram illustrating the flexible substrate with a patterned mold release region according to an embodiment of the invention.

The surface treatment includes providing a chemical agent 12 to react with a part of the bottom surface 11 of the flexible substrate 10 (referring to FIG. 3b), forming the mold release region 17 (referring to FIG. 3c). The mold release region 17 can be patterned, such as a rectangular, or circular pattern, or combinations thereof. Further, the mold release region 17 can be a discontinuous pattern, as shown in FIG. 5.

Figure 3D:
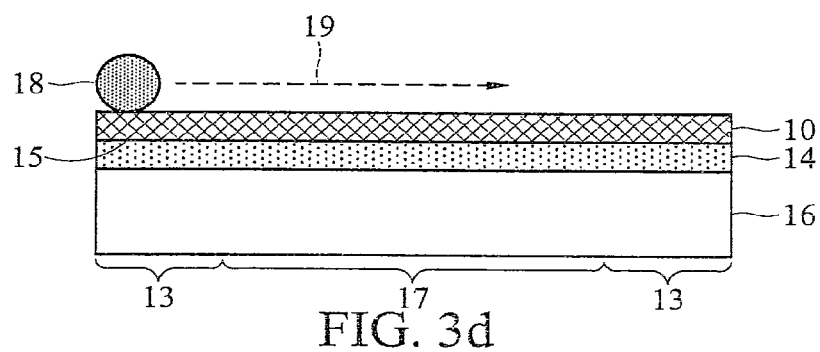

Next, as shown in FIG. 3d, the flexible substrate 10 is disposed and fixed on a support substrate 16 via an adhesive layer 14, wherein the bottom surface 11 (having a mold release region 17 and an adhesive region 13) faces the support substrate 16 and directly contacts to the adhesive layer 14. In this step, a roller 18 is provided to trundle toward a specific direction 19, facilitating the combination of the flexible substrate 10 and the adhesive layer 14. Particularly, the adhesive layer 14 covers the mold release region 17 and the adhesive region 13 simultaneously.

It should be noted that the adherence between the adhesive layer 14 within the mold release region 17 and the flexible substrate 10 is less than the adherence between the adhesive layer 14 within the adhesive region 13 and the flexible substrate 10. Accordingly, the fixation of the flexible substrate 10 for mounting on the adhesive layer 14 is provided by the adhesive region 13. Namely, the flexible substrate 10 is adhered on the support substrate 16 by the adherence between the adhesive layer 14 within the adhesive region 13 and the flexible substrate 10, thereby assuring the success of sequential processes of the flexible substrate 10.

For Example, in an embodiment of the invention, the adherence between the adhesive layer 14 within the adhesive region 13 and the flexible substrate 10 can be of between 1 B-5 B, and the adherence between the adhesive layer 14 within the mold release region 17 and the flexible substrate 10 can be of between 0 B-1 B. In another embodiment of the invention, the adherence between the adhesive layer 14 within the adhesive region 13 and the flexible substrate 10 can be of between 2 B-5 B, and the adherence between the adhesive layer 14 within the mold release region 17 and the flexible substrate 10 can be of between 0 B-2 B.

Figure 3E:
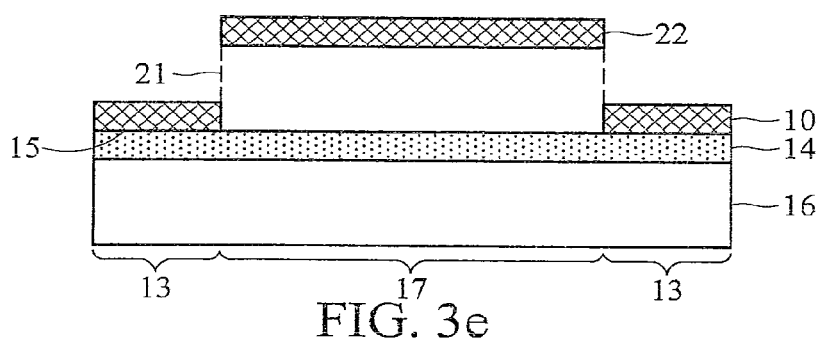
Figure 6:
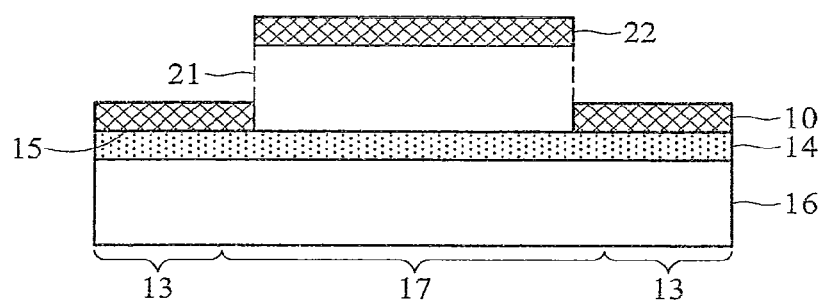
FIG. 6 shows a schematic diagram illustrating the flexible substrate and the mold release region with equal sizes.

Finally, as shown in FIG. 3e, the flexible substrate 10 within the mold release region 17 is cut along a cutting line 21, thus obtaining a cut flexible substrate 22. The cutting line 21 can be the edge of the mold release region 17, so that the size of the cut flexible substrate 22 is equal to the size of the mold release region 17. Further, as shown in FIG. 6, the cutting line 21 can be within the mold release region 17, so that the size of the cut flexible substrate 22 is smaller than the size of the mold release region 17.

In an embodiment of the invention, the chemical agent 12 is formed on the bottom 11 of the flexible 10 by dip coating, spin coating, imprinting, scraping, or roll-coating.

Figure 7A:
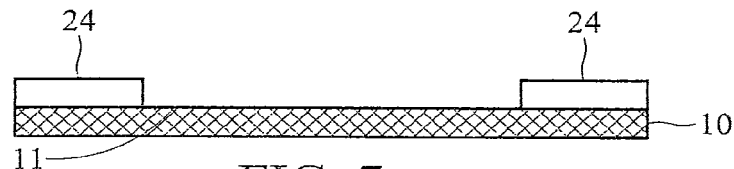
FIGS. 7a-7d are cross sections of a process for forming a chemical agent coating on the flexible substrate by spin coating according to an embodiment of the invention.
Figure 7B:
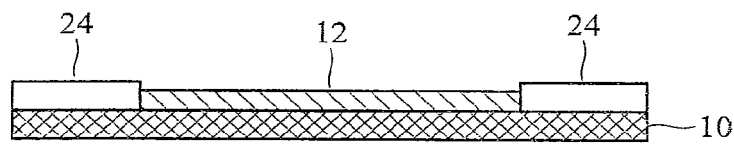
Figure 7C:
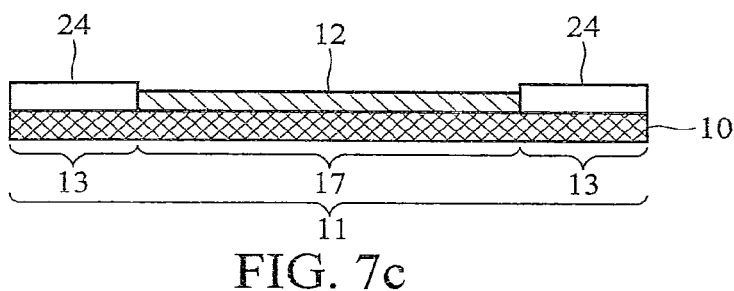
Figure 7D:
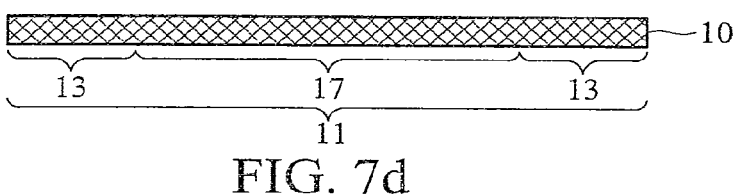

According to an embodiment of the invention, the chemical agent 12 is coated on the flexible substrate 10 by spin coating. First, as shown in FIG. 7a, a photoresist layer 24 is formed on the bottom surface 11 of the flexible substrate 10 by photolithography, exposing a predetermined mold release region of the bottom surface 11. Next, as shown in FIG. 7b, the chemical agent 12 is coated on the exposed bottom surface 11 by spin-coating. After the chemical agent reacts with the flexible substrate 10 to form a mold release region 17, the photoresist layer 24 is removed, as shown in FIGS. 7c and 7d.

Figure 8A:
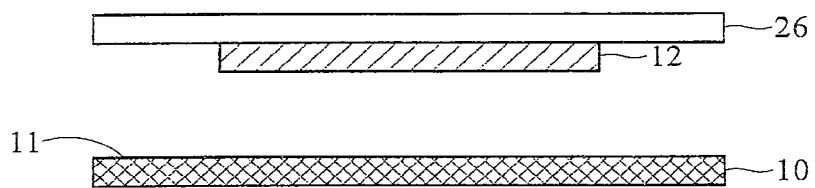
FIGS. 8a-8d are cross sections of a process for forming a chemical agent coating on the flexible substrate by imprinting according to another embodiment of the invention.
Figure 8B:
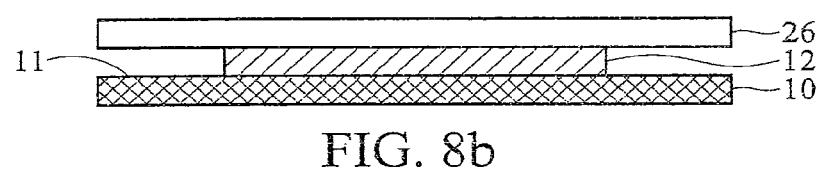
Figure 8C:
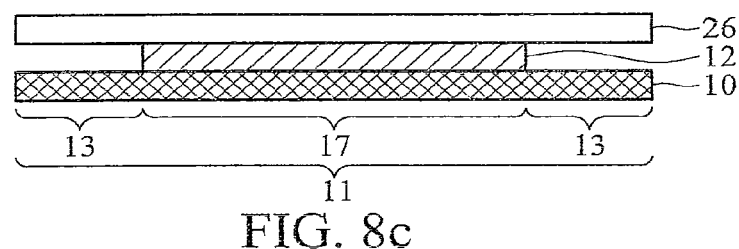
Figure 8D:
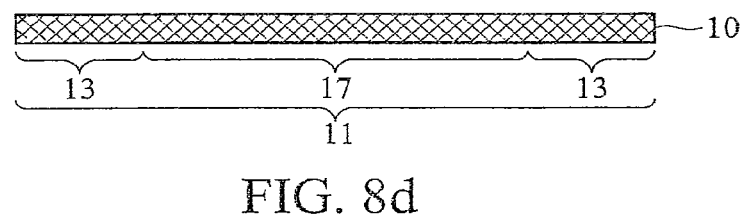

Further, according to an embodiment of the invention, the chemical agent 12 is formed on the flexible substrate 10 by imprinting. First, as shown in FIG. 8a, a chemical agent 12 coating is formed on a template 26 and aligned to the bottom surface of the flexible substrate 10. Next, as shown in FIG. 8b, the template 26 is imprinted to the bottom surface 11 of the flexible substrate 10, forcing the chemical agent coat to react with the predetermined mold release region of the bottom surface 11. After reaction for forming the mold release region 17, the template 26 is removed, as shown in FIGS. 8c and 8d.

Figure 9A:
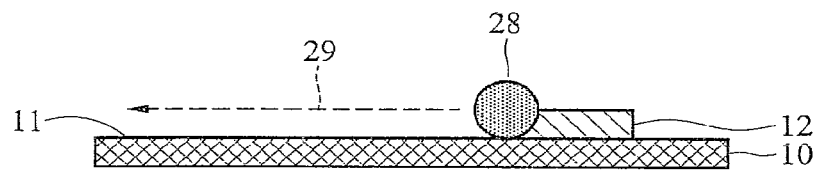
FIGS. 9a-9d are cross sections of a process for forming a chemical agent coating on the flexible substrate by roll-coating according to still another embodiment of the invention.
Figure 9B:
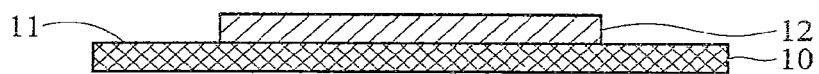
Figure 9C:
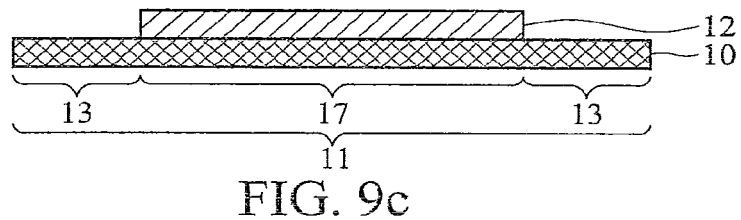
Figure 9D:
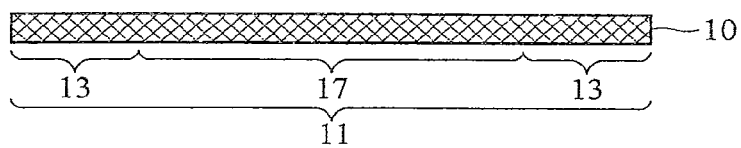
Figure 10:
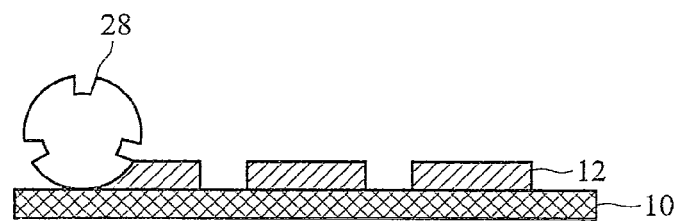
FIG. 10 is a cross section of a process for forming a patterned chemical agent coating on the flexible substrate by roller-type relief printing according to yet another embodiment of the invention.

Moreover, according to yet another embodiment, the chemical agent 12 is formed on the flexible substrate 10 by scraping or roll-coating. First, as shown in FIGS. 9a and 9b, a chemical agent coating is formed on a predetermined mold release region of the bottom surface 11 by a roller 28 (or a blade) toward a coating direction 29. After reaction, the mold release region 17 is obtained, as shown in FIGS. 9c and 9d. Further, a patterned chemical agent coating can be formed on the bottom surface 11 of the flexible substrate 10 for forming a patterned mold release region 17 by roller-type relief printing, as shown in FIG. 10.

Figure 11A:
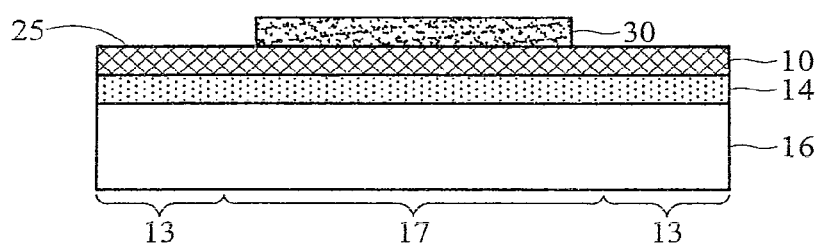
FIGS. 11a-11b are cross sections of a method for fabricating a flexible electronic device according to an embodiment of the invention.
Figure 11B:
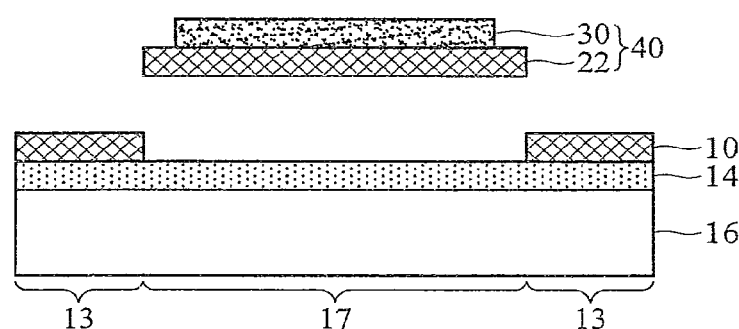

Some embodiments of the invention provide methods for fabricating flexible electronic devices as disclosed below. After the process shown in FIG. 3d, an electronic element 30 is formed on a top surface 25 of the flexible substrate 10 (the top surface 25 is the reverse side of the bottom surface 11 of the flexible substrate 10), as shown in FIG. 11a. Next, the flexible substrate 10 with the electronic element 30 is cut, isolating a flexible electronic device 40, as shown in FIG. 11b. The use of the electronic device is not limited and includes devices which are formed on a flexible structure, as known by those skilled in the art, such as transistor arrays, memory elements, flat panel displays, solar cells, semiconductor currents, or combinations thereof.

In the methods for isolating a flexible substrate from a support substrate and methods for fabricating a flexible electronic device of the invention, the cut flexible substrate can be isolated completely from the support substrate. The functional groups, which are able to react with an adhesive layer, of the flexible substrate are consumed, covered or displaced via the surface treatment. The methods for isolating a flexible substrate from a support substrate and methods for fabricating an electronic device of the invention have advantages such as having a simplified process and lower cost (e.g. using commercial available chemical agents etc.) when compared to other methods.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a flexible electronic device, comprising:
    providing a flexible substrate with a top surface and a bottom surface;
    subjecting a part of the bottom surface of the flexible substrate to a surface treatment, thereby forming a mold release region, wherein an adhesive region is the part of the bottom surface beyond the mold release region, and wherein the surface treatment comprises providing a chemical agent to react with the bottom surface of the flexible substrate, wherein the chemical agent has a structure represented by

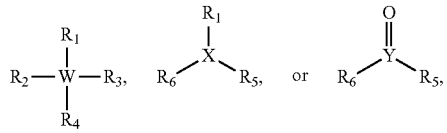

wherein W is C, Si, or Ge, X is S or Se, Y is C or S; $R_1$, $R_2$, and $R_3$ are independent and include H, alkenyl group, alkyl group, or —OR, R is $C_{1-18}$ alkyl group; $R_4$ is F, Cl, Br, I, carboxyl group, amino group, amine group, cyano group, amide group, alkyl halide group, or combinations thereof; and $R_5$ and $R_6$ are independent and include F, Cl, Br, I, alkyl group, alkenyl group, carboxyl group, amino group, amine group, cyano group, amide group, alkyl halide group, or combinations thereof;
    fixing the flexible substrate on a support substrate via an adhesive layer, wherein the adhesive layer covers the adhesive region and the mold release region;
    forming an electronic element on the top surface of the flexible substrate; and
    cutting the flexible substrate within the mold release region to isolate a flexible electronic device from the support substrate.

2. The method as claimed in claim 1, wherein the support substrate comprises a metallic substrate, a plastic substrate, a ceramic substrate, a glass substrate, or a silicon wafer.

3. The method as claimed in claim 1, wherein the flexible substrate comprises a polymeric substrate or a metallic substrate.

4. The method as claimed in claim 3, wherein the flexible substrate comprises polyimide (PI), polycarbonate (PC), polyethersulfone (PES), polynorbornene (PNB), polyetherimide (PEI), polyethylene naphthalate (PEN) or polyethylene terephthalate (PET).

5. The method as claimed in claim 1, after subjecting the bottom surface of the flexible substrate to the surface treatment, wherein functional groups of the bottom surface of the flexible substrate, which are able to form bonds with the adhesive layer, are consumed, covered or displaced.

6. The method as claimed in claim 5, wherein the functional groups which are able to be bonded with the adhesive layer comprises hydroxyl group, carboxyl group, amino group, or ester group.

7. The method as claimed in claim 5, wherein the bonds formed between the bottom surface of the flexible substrate and the adhesive layer comprises an ionic bond, a covalent bond or a hydrogen bond.

8. The method as claimed in claim 1, wherein the adherence between the flexible substrate within the mold release region and the adhesive layer is less than the adherence between the flexible substrate within the adhesive region and the adhesive layer.

9. The method as claimed in claim 1, wherein the size of the flexible electronic device is equal to the size of the mold release region.

10. The method as claimed in claim 1, wherein the size of the flexible electronic device is less than the size of the mold release region.

11. The method as claimed in claim 1, wherein the flexible electronic device comprises a transistor array, a memory element, a flat panel display, a solar cell, a semiconductor current, or combinations thereof.

12. The method as claimed in claim 1, wherein a surface area of an interface between the electronic element and the flexible substrate is not larger than a surface area of the mold release region.

13. A method for isolating a flexible substrate from a support substrate, comprising:
providing a flexible substrate with a bottom surface;
subjecting the bottom surface of the flexible substrate to a surface treatment, thereby forming a bottom surface with detachment characteristics, wherein the surface treatment comprises providing a chemical agent to react with the bottom surface of the flexible substrate, wherein the chemical agent has a structure represented by

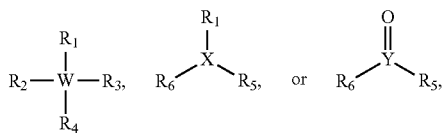

wherein W is C, Si, or Ge, X is S or Se, Y is C or S; $R_1$, $R_2$, and $R_3$ are independent and include H, alkenyl group, alkyl group, or —OR, R is $C_{1-18}$ alkyl group; $R_4$ is F, Cl, Br, I, carboxyl group, amino group, amine group, cyano group, amide group, alkyl halide group, or combinations thereof; and $R_5$ and $R_6$ are independent and include F, Cl, Br, I, alkyl group, alkenyl group, carboxyl group, amino group, amine group, cyano group, amide group, alkyl halide group, or combinations thereof;
fixing the flexible substrate on a support substrate via an adhesive layer, wherein the bottom surface with detachment characteristics faces the support substrate; and
isolating the flexible substrate from the support substrate.

14. The method as claimed in claim 13, wherein the support substrate comprises a metallic substrate, a plastic substrate, a ceramic substrate, a glass substrate, or a silicon wafer.

15. The method as claimed in claim 13, wherein the flexible substrate comprises a polymeric substrate or a metallic substrate.

16. The method as claimed in claim 15, wherein the flexible substrate comprises polyimide (PI), polycarbonate (PC), polyethersulfone (PES), polynorbornene (PNB), polyetherimide (PEI), polyethylene naphthalate (PEN) or polyethylene terephthalate (PET).

17. The method as claimed in claim 13, after subjecting the bottom surface of the flexible substrate to the surface treatment, wherein functional groups of the bottom surface of the flexible substrate, which are able to form bonds with the adhesive layer, are consumed, covered or displaced.

18. The method as claimed in claim 17, wherein the functional groups which are able to be bonded with the adhesive layer comprises hydroxyl group, carboxyl group, amino group, or ester group.

19. The method as claimed in claim 17, wherein the bonds formed between the bottom surface of the flexible substrate and the adhesive layer comprises an ionic bond, a covalent bond or a hydrogen bond.

20. The method as claimed in claim 13, wherein the chemical agent is provided to form on the bottom surface of the flexible substrate by dip coating, spin coating, imprinting, scraping, or roll-coating.

21. The method as claimed in claim 1, wherein the chemical agent is provided to form on the bottom surface of the flexible substrate by dip coating, spin coating, imprinting, scraping, or roll-coating.

* * * * *